(12) United States Patent
Peng et al.

(10) Patent No.: US 7,408,827 B1
(45) Date of Patent: Aug. 5, 2008

(54) PULSE GENERATION SCHEME FOR IMPROVING THE SPEED AND ROBUSTNESS OF A CURRENT SENSE AMPLIFIER WITHOUT COMPROMISING CIRCUIT STABILITY OR OUTPUT SWING

(75) Inventors: Tao Peng, Nashua, NH (US); Rajesh Venugopal, Nashua, NH (US)

(73) Assignee: Cypress Semiconductor Corp., San Jose, CA (US)

( * ) Notice: Subject to any disclaimer, the term of this patent is extended or adjusted under 35 U.S.C. 154(b) by 247 days.

(21) Appl. No.: 11/303,067

(22) Filed: Dec. 14, 2005

Related U.S. Application Data

(60) Provisional application No. 60/648,333, filed on Jan. 28, 2005, provisional application No. 60/639,201, filed on Dec. 22, 2004.

(51) Int. Cl.
*G11C 7/02* (2006.01)
(52) U.S. Cl. .................. 365/207; 365/205; 365/154
(58) Field of Classification Search .................. 365/207, 365/205, 154
See application file for complete search history.

(56) References Cited

U.S. PATENT DOCUMENTS

| | | | |
|---|---|---|---|
| 5,596,286 A | | 1/1997 | Houston |
| 5,602,785 A | * | 2/1997 | Casper .................. 365/189.11 |
| 5,724,292 A | * | 3/1998 | Wada .......................... 365/207 |
| 5,917,365 A | | 6/1999 | Houston |
| 6,501,696 B1 | | 12/2002 | Mnich et al. |
| 6,538,932 B2 | | 3/2003 | Ellis et al. |
| 6,768,143 B1 | | 7/2004 | Fredeman et al. |
| 2005/0195672 A1 | | 9/2005 | Lee |

OTHER PUBLICATIONS

Seevinck et al., "Current Mode Techniques for High-Speed VLSI Circuits with Application to Current Sense Amplifier for CMOS SRAM's," IEEE Journal of Solid-State Circuits, vol. 26, No. 4, Apr. 1991, pp. 525-536.
Wong et al., "Design and modeling of tapered LWL architecture for high density SRAM," © 2004 IEEE, 3 pages.
U.S. Appl. No. 11/247,945, filed Oct. 11, 2005.
U.S. Appl. No. 11/262,412, filed Oct. 28, 2005.
U.S. Appl. No. 60/648,333, filed Jan. 28, 2005.
U.S. Appl. No. 11/380,333, filed Apr. 26, 2006.
U.S. Appl. No. 11/259,342, filed Oct. 24, 2005.
U.S. Appl. No. 10/870,289, filed Jun. 16, 2004.
U.S. Appl. No. 10/873,608, filed Jun. 29, 2004.

* cited by examiner

*Primary Examiner*—Richard T. Elms
*Assistant Examiner*—Nam Nguyen
(74) *Attorney, Agent, or Firm*—Kevin L. Daffer; Daffer McDaniel, LLP

(57) ABSTRACT

Disclosed herein is a current sense amplifier (ISA) circuit with increased speed, less insensitivities to process variation, better stability and improved output signal swing. According to one embodiment, the ISA circuit described herein may include a pair of output nodes and a first pair of load transistors, each coupled between a different one of the output nodes and ground for pulling the output nodes down to a first voltage value at the beginning of a sense cycle. In addition, a pulse generation circuit is included for activating the first pair of load transistors at the beginning of the sense cycle and deactivating the first pair of load transistors once the first voltage is reached. When activated, the first pair of load transistors provide a relatively low resistance current path between the output nodes and ground. This decreases the output node discharge time and increases the overall speed of the sense amp without compromising circuit stability and output swing.

30 Claims, 5 Drawing Sheets

PULSE GENERATION SCHEME FOR IMPROVING THE SPEED AND ROBUSTNESS OF A CURRENT SENSE AMPLIFIER WITHOUT COMPROMISING CIRCUIT STABILITY OR OUTPUT SWING

PRIORITY APPLICATION

The present application claims priority to Provisional Application Ser. No. 60/639,201 entitled "A Pulse Controlled Resistor Scheme for use in Current Sense Amplifiers" filed Dec. 22, 2004, and Provisional Application Ser. No. 60/648,333 entitled "Novel feedback pulse generation scheme for use in Current Sense Amplifiers" filed Jan. 28, 2005.

BACKGROUND OF THE INVENTION

1. Field of the Invention

This invention relates to electronic circuits and, more particularly, to pulse generation circuits that may be used in a current sense amplifier (ISA) for improving speed and robustness without compromising circuit stability or output swing.

2. Description of the Related Art

The following descriptions and examples are given as background only.

Many semiconductor memories employ differential bit lines and some sort of differential amplifier or sensing circuit in their design. These differential amplifiers and sense circuits are commonly known as sense amplifiers (or "sense amps"). In addition to memory devices, sense amplifiers may be used in programmable arrays and other applications. A wide variety of sense amps are known in the art, including current sensing and voltage sensing variations.

For example, dynamic random access memory (DRAM) devices usually employ voltage sense amplifiers (VSAs) for detecting the state of a DRAM memory cell. In voltage sensing, the bitline is precharged before the memory cell is activated. When the memory cell is activated, the memory cell charges or discharges the bit line to maintain or change the voltage of the bit line. However, the bit line may be quite long and loaded by a large number of memory cells in some memory devices (e.g., large memory arrays), resulting in a large capacitive load for the memory cell. In some cases, the memory cell may not be able to provide enough cell current to quickly discharge or charge a large bit line, and an excessive amount of time may be needed to read the memory cells. Therefore, voltage sensing may not be the preferred sensing scheme in all memory devices.

For this reason, current sense amplifiers (ISAs) are sometimes used in memory device circuits. Because current sense amplifiers provide sensing speeds that are independent of the capacitive loads on the bit lines, they are well suited in large memory arrays that are subject to large loads on the bit lines. Located in a sense amplifier cell, the current sense amplifier measures a current and turns this into a small voltage difference output. In some cases, the output of a current sense amplifier may be passed to a voltage sense amplifier (VSA), which is also located in the sense amplifier cell for amplifying the low voltage signal into a higher voltage signal. The output of the voltage sense amplifier may then be passed as the output of the sense amplifier cell.

FIG. 1 illustrates one embodiment of a current sense amplifier 100, which may be used for detecting a current differential between the complementary bit lines of a memory array (such as memory array 150). In the embodiment shown, ISA 100 is coupled for receiving a pair of differential currents ($I_{BL}$, $I_{BLB}$) from one or more complementary bit lines (BL, BLB) of memory array 150. In some cases, ISA 100 may be coupled for receiving a pair of differential currents from only one column of memory cells, as shown in FIG. 1. In other cases, ISA 100 may be coupled for receiving a pair of differential currents from more than one column of memory cells (not shown). If the memory array includes more than one column of memory cells, column multiplexers (COLMUX) are generally used to switch between the different pairs of bit lines.

As shown in FIG. 1, current sense amplifier 100 may include a pair of PMOS cross-coupled transistors (M2a, M2b), a pair of PMOS load transistors (M3a, M3b), a pair of PMOS pull-up transistors (M4a, M4b) and an NMOS enable transistor (M5). When employed within a memory device, differential bit line currents ($I_{BL}$, $I_{BLB}$) may be supplied to the source terminals of cross-coupled transistors M2a and M2b during a read operation. To be "cross-coupled," the gate terminal of PMOS transistor M2a must be coupled to the drain terminal of PMOS transistor M2b, and vice versa. The drain terminals of cross-coupled transistors M2a and M2b may then be coupled to ground through load transistors M3a, M3b and enable transistor M5. Pull-up transistors M4a and M4b are used for precharging the output nodes (out, out_b) of the current sense amplifier before the read (or "sense") operation begins. Once the sense amplifier is enabled (e.g., when an active enable signal, "en," is supplied to transistor M5), ISA 100 converts the pair of differential currents into a pair of differential voltages by allowing load transistors M3a, M3b to discharge the output nodes before a voltage difference is allowed to develop there between. In some cases, the pair of differential voltages may be supplied to a voltage sense amplifier (not shown). If used, the VSA may amplify the differential voltages (e.g., up to CMOS levels) and use the amplified voltages to generate a single-ended sense amplifier output voltage.

In FIG. 1, cross-coupled PMOS devices M2a and M2b provide a virtual short between the bit lines. This enables current from the memory cell to immediately begin flowing into the source terminals of these devices. This cross-coupled topology and the virtual short it creates makes the current sensing approach relatively insensitive to bit line loading, and hence, faster for large memory arrays as compared to conventional voltage sensing schemes.

The PMOS load devices (M3a and M3b) coupled below cross-coupled devices M2a and M2b serve two purposes. The first purpose is to convert the cell current into a voltage difference between output nodes out and out_b, which may then serve as inputs to a subsequent voltage sensing stage. The delay attributed to the current sensing stage may be described as the time it takes for the voltage difference to develop into a value, which is large enough for the voltage sensing stage to detect and amplify (e.g., the delay of the current sensing stage must account for input offsets of the voltage sensing stage with room for extra overdrive). The second purpose of the PMOS load devices (M3a and M3b) is to stabilize the current sense amplifier circuit. For example, if the resistance of load devices M3a and M3b is too low, a negative impedance may be created at the inputs of cross-coupled transistors M2a and M2b, which may cause the circuit to oscillate. Therefore, load devices M3a and M3b are generally required to have a large resistance in order to provide the desired signal swing and circuit stability.

However, a trade-off arises between load resistance and the delay of the current sensing stage. For example, when the bit lines are inactive, all nodes are precharged to a power supply voltage (vpwr) by the pull-up transistors (M1a and M1b) in the memory array and the pull-up transistors (M4a and M4b) in the ISA. Assuming that the memory array is initially disabled when the sense amp is enabled, nodes out and out_b (which are initially at vpwr) will start to discharge. The output node voltages will eventually settle to a maximum common mode value that is given by a voltage division between the resistances above and below the output nodes. Since the output node voltages started at vpwr, the output capacitance discharges through PMOS loads M3a and M3b with a common mode time constant, which is proportional to the PMOS load resistance. Once the output node voltages settle to the maximum common mode value, the memory cell current flows through the PMOS loads to create the voltage difference between output nodes out and out_b.

The tradeoff is that in order to satisfy the stability and voltage swing criteria listed above, the PMOS load resistances have to be made large. If the PMOS load resistances are made large, the common mode settling time of output nodes out and out_b is increased. This common mode settling delay directly adds to the delay of the current sensing stage. This is shown in FIG. 2, where the delay in reaching the maximum common mode voltage (before the output nodes begin to split) is almost 50% of the total delay of the current sensing stage (which is approximately 6 ns to 8 ns in FIG. 2). As used herein, the total delay of the current sensing stage is defined as the time needed for the difference in the out and out_b voltages to reach 100 mV. This number is based on the expected input offset voltage of the following voltage sensing stage.

Therefore, it would be desirable to provide a current sense amplifier scheme where speed is not compromised for stability or for developing the desired differential split between the output nodes.

SUMMARY OF THE INVENTION

The following description of various embodiments of memory devices, current sense amplifiers and methods is not to be construed in any way as limiting the subject matter of the appended claims.

According to one embodiment, a current sense amplifier circuit is provided herein for maintaining circuit stability and a desired output signal swing without compromising speed. For example, the current sense amplifier (or "sense amp") may be configured for receiving a pair of differential currents supplied to input nodes of the current sense amplifier and for generating a pair of differential voltages in response thereto. In some cases, the current sense amplifier may include a pair of cross-coupled transistors, a first pair of load transistors, a pair of pull-up transistors and an enable transistor. Before the sense amp is enabled, the pair of pull-up transistors may be used to pull the output nodes of the current sense amplifier up towards a power supply voltage. Once the sense amp is enabled (e.g., by supplying an enable signal to the enable transistor), the first pair of load transistors may generate the pair of differential voltages from the pair of differential currents received by the pair of cross-coupled transistors. The pair of differential voltages may then be supplied to the output nodes of the current sense amplifier.

Unlike other sense amp designs, the current sense amplifier described herein includes an additional pair of load transistors, each coupled between a different one of the output nodes and ground for pulling the output nodes down to a first voltage value at the beginning of a sense cycle. In addition, a pulse generation circuit is included for activating the additional pair of load transistors at the beginning of the sense cycle and deactivating the additional pair of load transistors once the first voltage is reached. The pulse generation circuit and the current sense amplifier are each activated by the enable signal supplied to the pulse generation circuit and the enable transistor of the current sense amplifier.

Because the resistance through the additional pair of load transistors is substantially less than the resistance through the first pair of load transistors (e.g., by at least an order of magnitude), the additional pair of load transistors provide a low resistance path from the output nodes to ground at the beginning of the sense cycle. This enables the output nodes to be quickly discharged to a predetermined voltage value, before a voltage differential (i.e., the pair of differential voltages) develops across the output nodes. Once the output nodes are discharged, the high resistance path through the first pair of load transistors takes over to provide the desired output signal swing and circuit stability. In this manner, the current sense amplifier described herein increases sensing speed without compromising output swing or stability.

In some cases, the pulse generation circuit may include a logic gate and one or more buffers. For example, a first input of the logic gate may be coupled for receiving the enable signal, while a second input of the logic gate is coupled for receiving a time delayed pulse. An output of the logic gate may then be coupled to gate terminals of the additional pair of load transistors for supplying a control signal thereto. In this manner, the pulse generation circuit may be configured for activating the additional pair of load transistors upon receiving the enable signal, and for deactivating the additional pair of load transistors a predetermined time period after the sense cycle begins. In one example, the predetermined time period may be substantially equal to the time needed for the output nodes of the current sense amplifier to be discharged to an optimum common mode voltage.

In other cases, the pulse generation circuit may include an operational amplifier having a first input coupled for receiving one of the differential voltages, a second input coupled for receiving a reference voltage, and an output coupled to gate terminals of the additional pair of load transistors for supplying a feedback control signal thereto. As in the previous case, the operational amplifier (or "feedback amplifier") may also be controlled by the enable signal. In this manner, the pulse generation circuit may be configured for activating the additional pair of load transistors upon receiving the enable signal, and for deactivating the additional pair of load transistors as soon as the received one of the differential voltages falls below the reference voltage.

In one example, the reference voltage may be a fixed value, which is predetermined and set close to the optimum common mode voltage of the output nodes. In another example, the reference voltage may be a dynamically adjustable value that starts at a lower voltage value before rising to a higher voltage value, which is predetermined and set close to the optimum common mode voltage of the output nodes. Regardless, the operational amplifier may be configured for automatically adjusting a pulse width of the feedback control signal supplied to the additional pair of load transistors, so that operation of the current sense amplifier is unaffected by variations in process, voltage and temperature. As such, the current sense amplifier may be particularly useful in asynchronous memory devices, which often suffer from pulse width variation.

According to another embodiment, a memory device may be provided herein. For example, the memory device may include a plurality of memory cells arranged in rows and columns. In addition, a current sense amplifier may be included for receiving a pair of differential currents from at least some of the plurality of memory cells and for generating a pair of differential voltages there from. In some cases, the current sense amplifier may include a pair of output nodes, a first pair of load transistors and a second pair of load transistors. Each transistor within the first and second pairs of load transistors may be coupled between a different one of the output nodes and ground. However, the second pair of load transistors may have a relatively lower resistance (e.g., an order of magnitude lower) than the first pair of transistors. This enables the second pair of load transistors to provide a lower resistance current path to ground at the beginning of a sense cycle.

In addition, the current sense amplifier may include a pulse generation circuit, which is coupled for: (i) activating the second pair of load transistors to quickly discharge the output nodes from a relatively high voltage to a relatively low voltage at the beginning of a sense cycle, and (ii) deactivating the second pair of load transistors to enable the first pair of load transistors to generate the pair of the differential voltages at the output nodes, after the relatively low voltage is reached. The pulse generation circuit may include a simple logic gate with buffers or an operational amplifier, as described above.

According to another embodiment, a method is provided herein for operating a current sense amplifier circuit. As noted above, the current sense amplifier circuit may include a pair of output nodes, a first pair of load transistors and a second pair of load transistors, among other circuit components. As such, the method may include: (i) precharging the pair of output nodes towards a power supply voltage before a sense cycle begins, (ii) activating the second pair of load transistors to quickly discharge the pair of output nodes at the beginning of the sense cycle, and (iii) deactivating the second pair of load transistors once a voltage value of the output nodes approaches an optimum common mode voltage. By deactivating the second pair of load transistors, the first pair of load transistors are enabled to generate a pair of differential voltages from a pair of differential currents supplied to the current sense amplifier. In some cases, the step of deactivating may include supplying a deactivation control signal to the second pair of load transistors a predetermined amount of time after the sense cycle begins. In other cases, the step of deactivating includes comparing the voltage value of the output nodes to a reference voltage, and supplying a deactivation control signal to the second pair of load transistors once the voltage value falls below the reference voltage. As noted above, the reference voltage may be a fixed or dynamically adjustable value.

BRIEF DESCRIPTION OF THE DRAWINGS

Other objects and advantages of the invention will become apparent upon reading the following detailed description and upon reference to the accompanying drawings in which.

Figure 1:
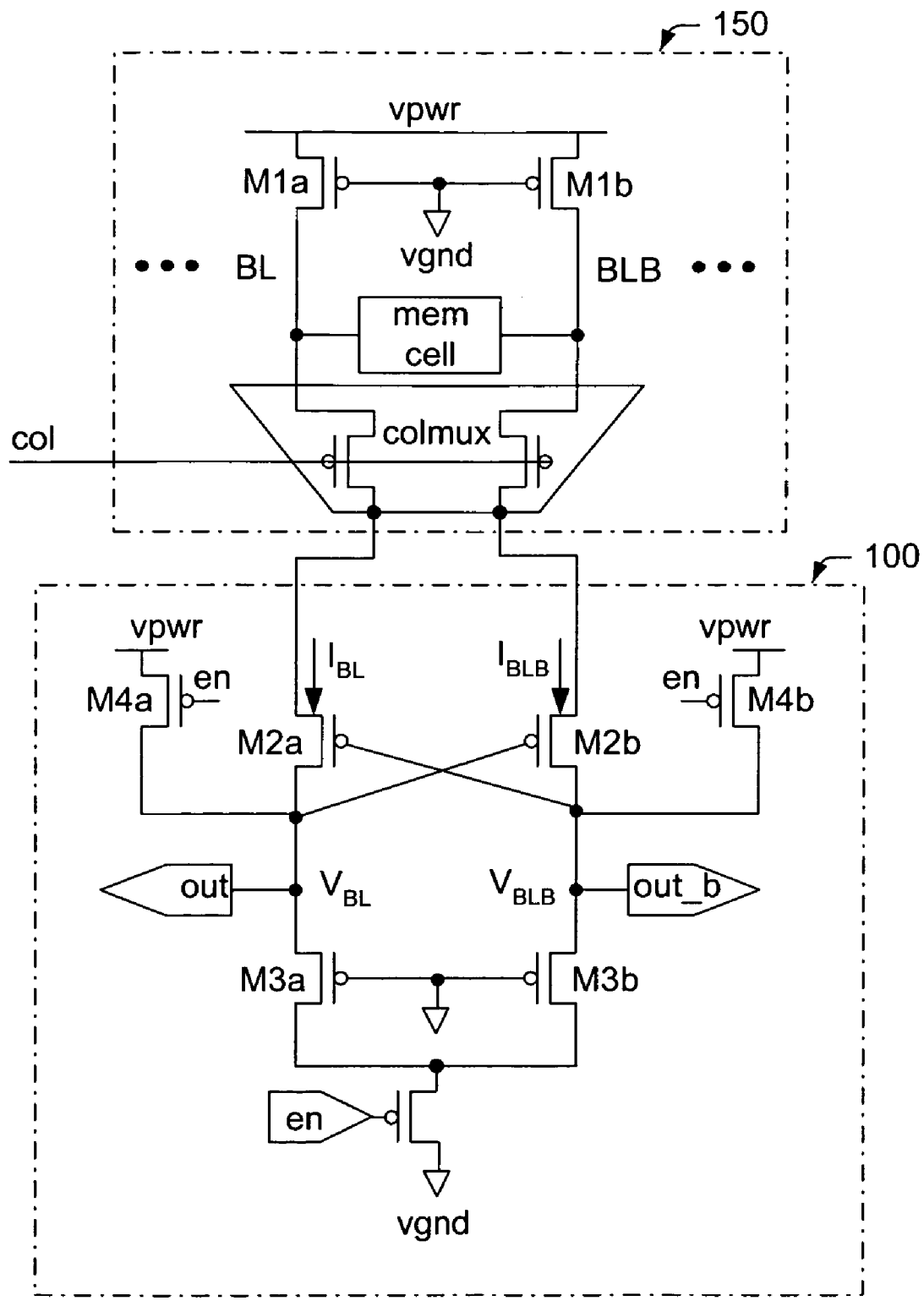
FIG. 1 is a circuit schematic illustrating one embodiment of a current sensing stage.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3A:
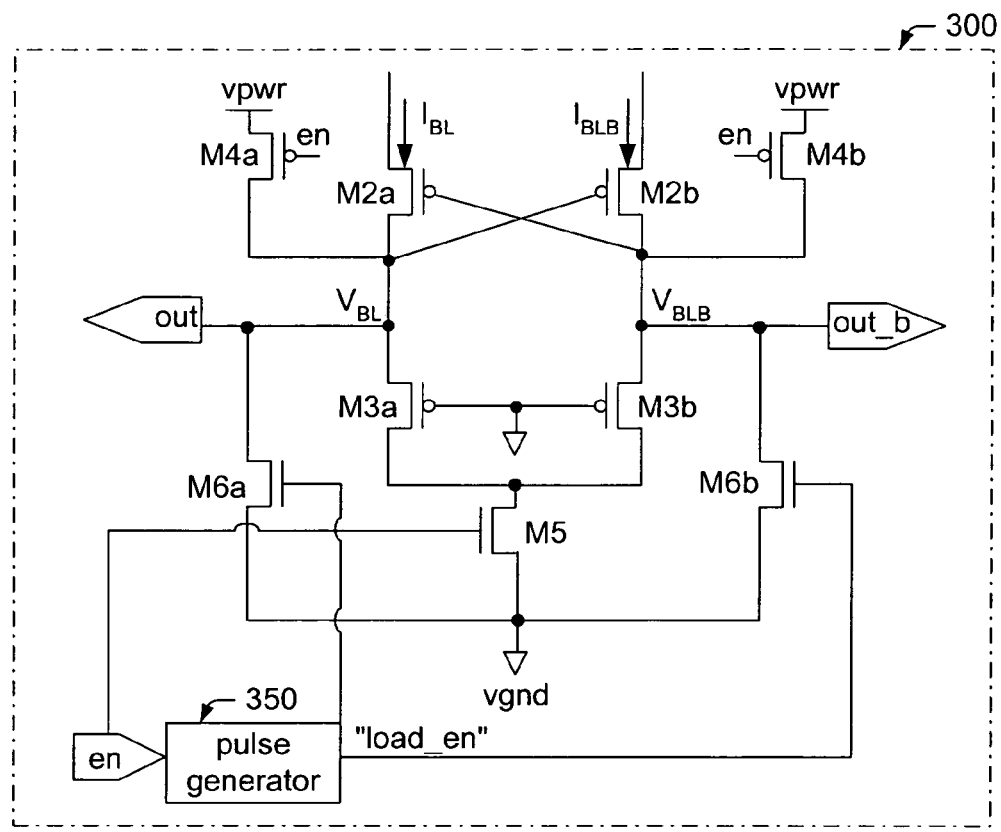
FIG. 3A is a circuit schematic illustrating one embodiment of an improved current sensing stage, including an additional pair of load devices controlled by a pulse generator.

One embodiment of an improved current sense amplifier 300 is described and shown in FIG. 3A. The improved current sense amplifier is well suited for use in both synchronous and asynchronous memory devices, and in one preferred application, may be used within a high speed, dual-port, asynchronous static RAM (SRAM) device. However, it is noted that the inventive concepts described herein are not limited to a particular memory device, and instead, may be applied to various types of memory (including, but not limited to, various types of ROM, RAM, and FLASH memories), as well as other applications (such as programmable arrays).

As noted above, conventional current sense amplifiers tend to place conflicting requirements on speed, stability and output voltage swing. For example, the resistance of PMOS load transistors M3a, M3b is usually made large in order to meet desired signal swing and stability requirements. However, large load resistances translate into a large RC time constant for discharging the output nodes. This increases the time delay needed to establish an optimum common mode voltage before a differential voltage can develop across the output nodes.

Figure 2:
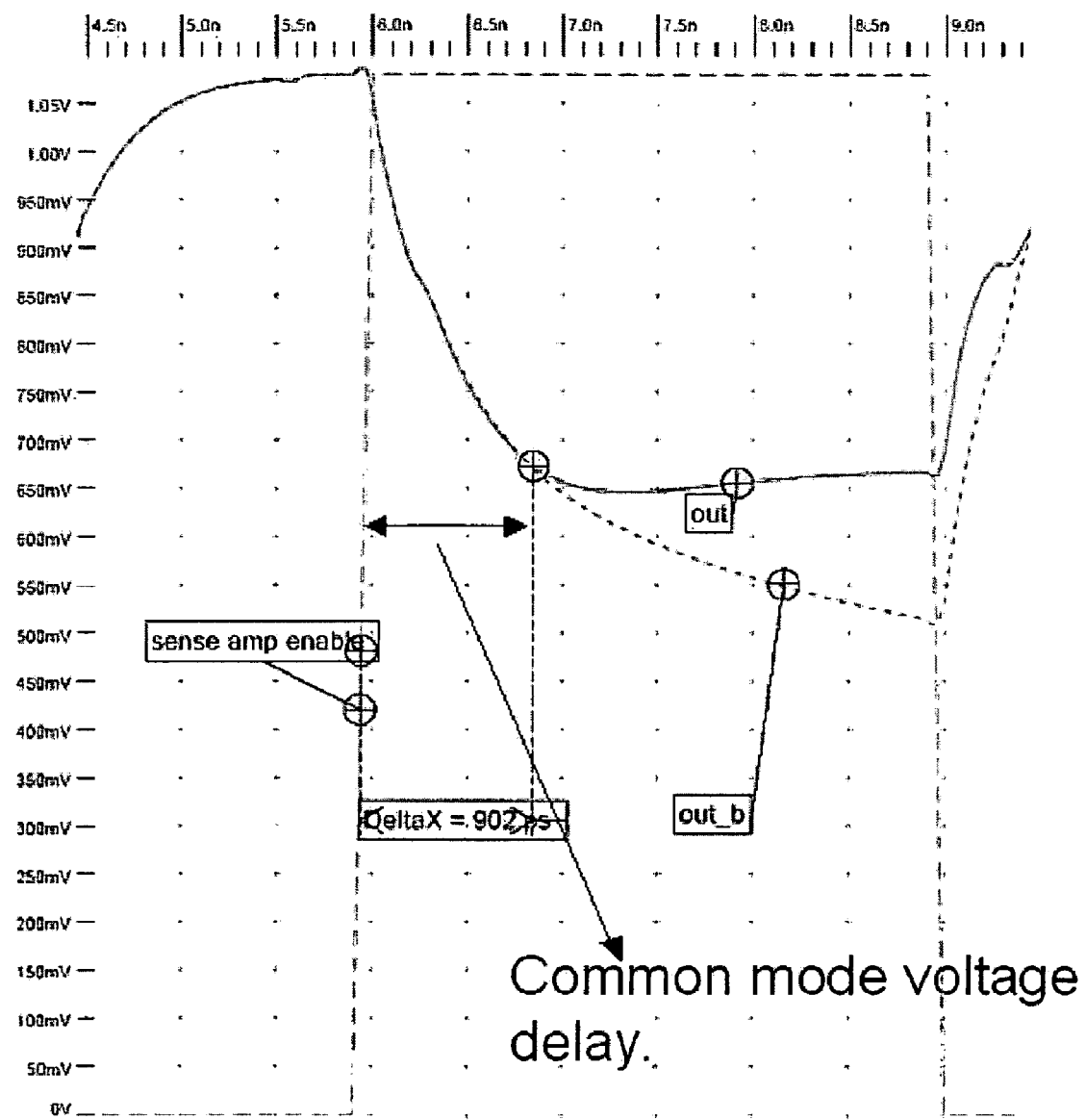
FIG. 2 is a graph illustrating output waveforms of the current sensing stage of FIG. 1.

As used herein, the common mode voltage (CMV) is the value or values at which the output node voltages remain the same, before a voltage differential develops across the output nodes. An optimum CMV occurs just before the output node voltages begin to split into differential voltages, as shown, e.g., in FIG. 2. The CMV time delay may, therefore, be described as the time needed to establish the optimum common mode voltage before a differential voltage can develop across the output nodes.

The current sense amplifier shown in FIG. 3A improves upon conventional designs by decoupling the requirements on speed, stability and voltage swing. This enables current sense amplifier (ISA) 300 to provide a significantly faster design, while meeting stability and voltage swing requirements. In some cases, ISA 300 may increase sensing speed up to about 50% over the conventional design shown in FIG. 1.

In the embodiment shown, ISA 300 is constructed using Complementary Metal Oxide Semiconductor (CMOS) technology, and therefore, will be described through the various interconnections that exist between the gate, source and drain terminals of the CMOS transistors. However, the inventive concepts described herein are not limited to CMOS, and may be equally applicable to other process technologies, in other embodiments of the invention.

Similar to the previous embodiment shown in FIG. 1, current sense amplifier 300 may include a pair of PMOS cross-coupled transistors (M2a, M2b), a pair of PMOS load transistors (M3a, M3b), a pair of PMOS pull-up transistors (M4a, M4b) and an NMOS enable transistor M5. The gate terminal of transistor M2a is coupled to the drain terminal of transistor M2b, while the gate terminal of transistor M2b is coupled to the drain terminal of transistor M2a. For this reason, transistors M2a and M2b are said to be "cross-coupled." The source terminals of cross-coupled transistors M2a and M2b are coupled for receiving a differential input signal. When incorporated within a memory device, the source terminals of transistors M2a and M2b may be coupled for receiving a pair of differential currents ($I_{BL}$, $I_{BLB}$) from one or more complementary bit lines (BL, BLB) of a memory device (such as memory device 150 of FIG. 1). However, it is noted that other differential input signals may be supplied to cross-coupled transistors M2a and M2b, in other embodiments of the invention.

The drain terminals of cross-coupled transistors M2a and M2b are coupled to the source terminals of load transistors M3a and M3b, respectively. The gate terminals of transistors M3a and M3b are coupled together (i.e., mutually-connected) and coupled to ground. The drain terminals of transistors M3a and M3b are also coupled together (i.e., mutually-connected) and coupled to the drain terminal of enable transistor M5. The drain-to-source path of transistor M5 is coupled between the drain terminals of load transistors M3a, M3b and ground. In this configuration, the current sense amplifier may be activated (i.e., turned-on) when an active sense amplifier enable (en) signal is supplied to the gate terminal of transistor M5. In the current embodiment, the current sense amplifier is activated with a logic high "en" signal and deactivated with a logic low "en" signal. However, it is noted that the opposite may be true in alternative embodiments of the invention.

The drain terminals of cross-coupled transistors M2a and M2b are also coupled to the drain terminals of pull-up transistors M4a and M4b and to output nodes "out" and "out_b," respectively. Before a sense cycle begins (e.g., when the "en" signal is low), pull-up transistors M4a and M4b function to charge the output nodes by pulling them up towards a power supply voltage (vpwr). This is typically done to maintain stability in the memory cells. However, it is noted that such a feature may not be utilized in all types of memory devices.

When the "en" signal goes high, the current sense amplifier (ISA) is enabled, and cell current starts flowing into the source terminals of cross-coupled transistors M2a and M2b. The differential currents ($I_{BL}$, $I_{BLB}$) are translated into a differential voltage ($V_{BL}$, $V_{BLB}$) by transistors M3a, M3b and supplied to the output nodes of ISA 300. In some cases, the differential voltage may then be supplied to a second stage voltage sense amplifier (not shown) for further voltage amplification.

Current sense amplifier 300 provides many improvements over the configuration shown in FIG. 1. For example, current sense amplifier 300 includes an additional pair of NMOS load transistors M6a and M6b. The additional pair of load transistors are each coupled between a different one of the output nodes (out, out_b) and ground for providing a low resistance path there between. In one example, the resistance of NMOS load transistors M6a and M6b may be at least an order of magnitude lower than the resistance of PMOS load transistors M3a and M3b, such that $R_{M3}=10*R_{M6}$. However, it is noted that the resistive difference between the PMOS and NMOS load transistors is not limited to the exemplary ratio provided herein; alternative ratios may be used when appropriate. As described in more detail below, the low resistance path provided by NMOS load transistors M6a and M6b enables the output nodes of current sense amplifier 300 to be quickly discharged at the beginning of a sense cycle, thereby reducing the CMV delay and increasing the overall sensing speed of the sense amp.

NMOS load transistors M6a and M6b are added for increasing the speed of ISA 300, while PMOS load transistors M3a, M3b are used to maintain the desired signal swing and circuit stability. For example, NMOS load transistors M6a and M6b may be turned on at the beginning of the sense cycle, as soon as the current sense amplifier is activated (e.g., with an active high "en" signal). Turning on transistors M6a and M6b enables the output nodes (out and out_b) of ISA 300 to be quickly discharged to an optimum common mode voltage through the low resistance path provided by the NMOS loads. In other words, the lower resistance of NMOS transistors M6a, M6b (as compared to PMOS transistors M3a, M3b) decreases the CMV time delay needed to discharge the output nodes by reducing the RC time constant. Once the output nodes reach the optimum common mode voltage, transistors M6a and M6b may be turned off to allow a voltage difference to develop across the output nodes. Once NMOS transistors M6a and M6b are deactivated, PMOS transistors M3a, M3b take over, providing the desired output signal swing and circuit stability through the higher resistance current path associated therewith.

The optimum common mode voltage of the output nodes (out and out_b) may also be described herein as the high gain point of the current sense amplifier. It is also the value that puts the voltage sensing stage following the current sensing stage at its correct operating point (i.e., the high gain point of the voltage sensing stage). The optimum common mode voltage may be predetermined through simulation techniques. As described in more detail below, the optimum common mode voltage may be used to set a predetermined reference voltage.

Figure 3B:
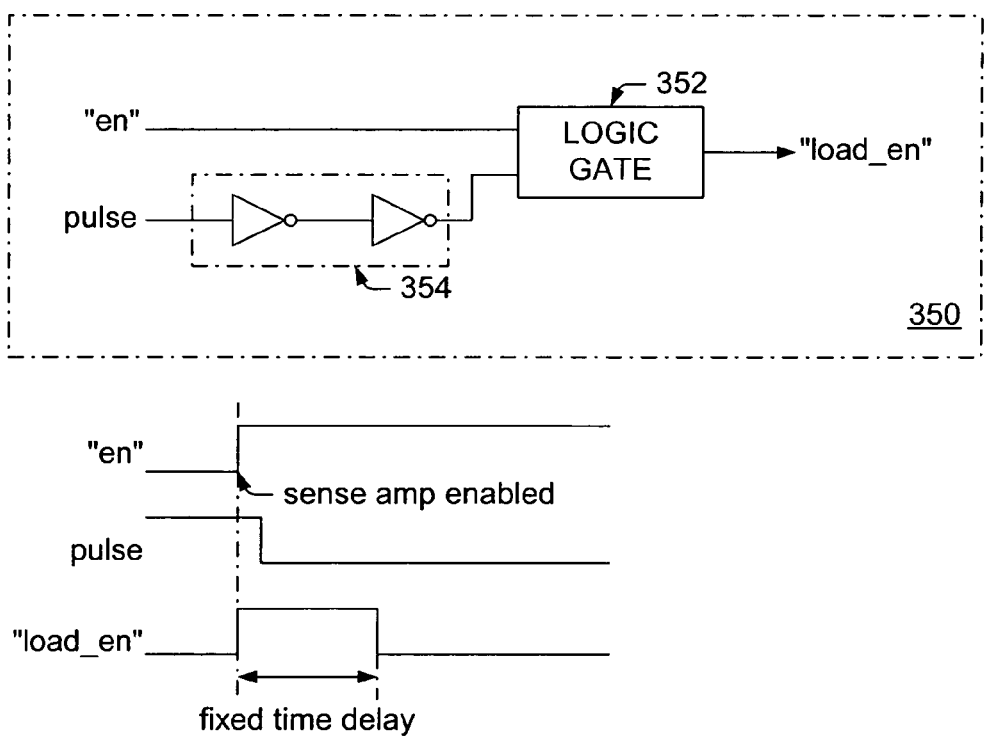
FIG. 3B is a circuit schematic illustrating one embodiment of a pulse generator.

In the embodiment of FIG. 3A, the additional pair of NMOS load transistors are controlled by a pulse generator 350, which in turn, is controlled by the sense amplifier enable ("en") signal. In one embodiment, pulse generator 350 could be a simple pulse generation circuit made up of a 2 input AND gate with one leg of the input being delayed by some inverters. As shown in FIG. 3B, for example, pulse generator 350 may include AND gate 352 having one input coupled for receiving the "en" signal and another input coupled for receiving a time delayed pulse. In some cases, the pulse may be delayed by a number of inverters (or buffers) 354. Although two inverters are shown in the embodiment of FIG. 3B, the actual number of delay elements used may depend on the minimum amount of time needed for the output nodes to reach the optimum common mode voltage (i.e., the minimum CMV time delay). For example, the optimum common mode voltage of the output nodes may be predetermined through simulation techniques, as described above. A number of inverters/buffers may then be chosen to produce a time delay, which is substantially equal to the minimum CMV time delay.

The timing diagram of FIG. 3B illustrates how the additional pair of load transistors may be activated/deactivated by the "load_en" signal provided by pulse generator 350, according to one embodiment of the invention. For example, a logic low "en" signal and a logic high "pulse" signal may be supplied to the inputs of AND gate 352 before the current sense amplifier is enabled. At this time, the NMOS load transistors (M6a, M6b) will be deactivated, along with the other transistors in the sense amp. Once the sense amp is enabled with a logic high "en" signal, AND gate 352 may generate a logic high "load_en" signal to activate the NMOS load transistors. At about the same time, the "pulse" signal may transition from logic high to logic low. In doing so, the NMOS load transistors may be deactivated as soon as the time delayed logic low "pulse" signal is supplied to the input of AND gate 352. Preferably, the pulse width of the logic high "load_en" signal provides sufficient time for the output nodes to be discharged to a voltage value, which is close (if not equal) to the optimum common mode voltage of those nodes.

Although a specific configuration of pulse generator 350 is shown in FIG. 3B and described herein, the pulse generator could be one of many generic pulse generators which are commonly used. For example, pulse generator 350 may be alternatively implemented with other forms of combinatorial logic.

The improved circuit shown in FIG. 3A provides a current sensing stage with a pair of PMOS load devices, whose resistance is consistent with obtaining the desired differential voltage magnitude and meeting the desired stability criteria, along with an additional pair of NMOS load devices and pulse generator. As such, the improved current sensing stage decouples the common mode time delay from the memory cell read voltage amplification delay by using a pulse activated load for providing a low resistance current path to ground at the beginning of a sense cycle. The pulse activated load is used for quickly discharging the output node voltages to a value, which is close (if not equal) to the optimum common mode value, when the sense amp is enabled. Once the optimum common mode voltage is reached, the pulse activated load is turned off and the circuit behaves like the circuit of FIG. 1.

As noted above, sense amp 300 improves upon sense amp 100 by decreasing the CMV time delay of the output nodes, thus, reducing the overall time delay of the current sense amplifier stage. In addition, the low resistance paths provided by NMOS load transistors M6a, M6b (from the output nodes to ground) eliminate the instability concerns of sense amp 100 by essentially shorting the output nodes to ground at the beginning of the sense cycle. This improves circuit stability by preventing negative impedances from developing at this point.

As noted above, the optimum common mode voltage of the output nodes (out and out_b) is the high gain point of the current sensing stage. In some cases, the pulse width of a simple pulse generator may be sensitive to variations in process, voltage and temperature (PVT). If the pulse width is too large, the output nodes may be pulled down to a value, which is actually lower than the optimum common mode voltage. In other words, variations in PVT may cause sense amp 300 to undershoot the optimum CMV value, thereby introducing an additional recovery time as the voltage value of the output nodes drops lower than the desired DC value. The recovery time may undesirably increase the output node discharge time (i.e., the CMV time delay) and require pulse width optimization to minimize undershoot. Undershoot may also cause noise issues at the chip level.

Therefore, it would be desirable, in some cases, to provide a pulse generation scheme where the "load_en" pulse width is determined by the comparison of the output node voltages to a reference value, which is set close to the optimum common mode voltage. This would improve the robustness of the sense amp design, in addition to providing the advantages described above.

Figure 4A:
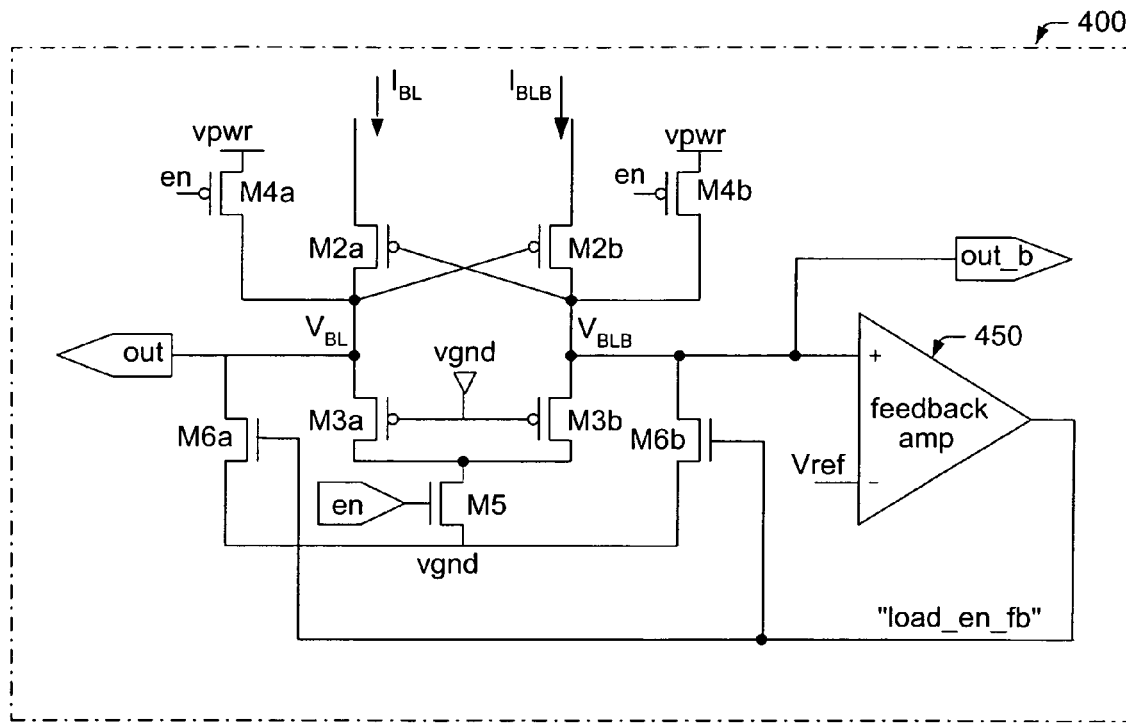
FIG. 4A is a circuit schematic illustrating another embodiment of an improved current sensing stage, including an additional pair of load devices controlled by a feedback amplifier.
Figure 4B:
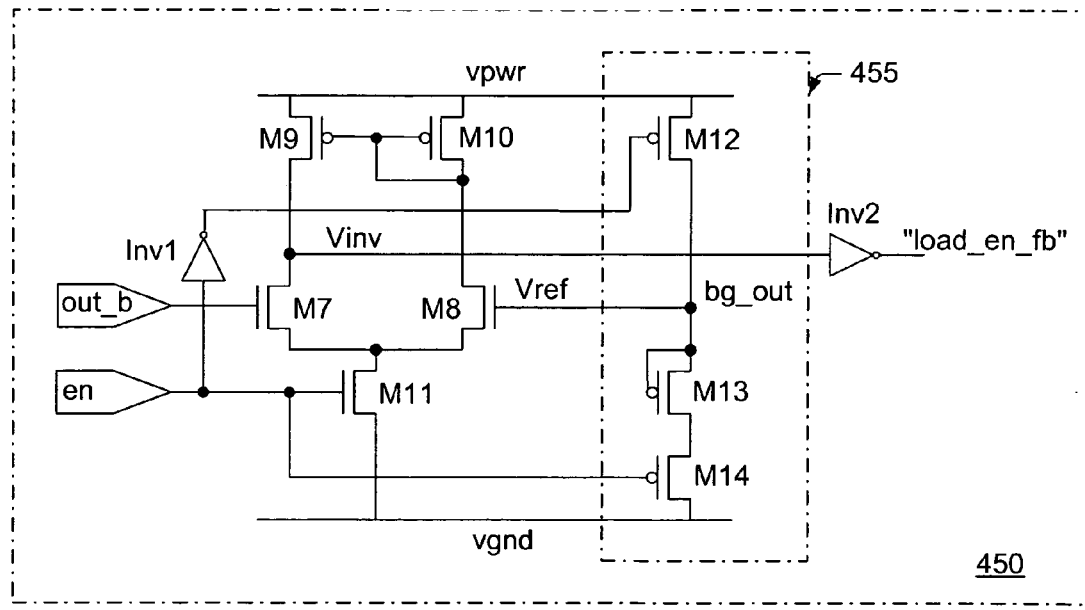
FIG. 4B is a circuit schematic illustrating one embodiment of a feedback amplifier with bias generation.

FIGS. 4A and 4B illustrate a self timed pulse generation circuit 450 that compares the output voltage of a current sense amplifier 400 to a predetermined reference voltage, which is close to the optimum CMV value of the output nodes. Unlike previous embodiments, the self timed pulse generation scheme is relatively insensitive to process, voltage and temperature variations. For example, pulse generation circuit 450 differs from the simple pulse generator used in FIG. 3 by eliminating the reduction in speed gain that may occur when the output node voltages fall below (i.e., undershoot) the desired CMV value.

Many of the circuit elements shown in FIG. 3 are included within current sense amplifier 400 of FIG. 4. The detailed description of similar circuit elements will not be repeated herein for the purpose of brevity. In general, sense amplifier 400 differs from sense amplifier 300 by replacing the simple pulse generator 350 with a self timed pulse generator 450. In one embodiment, self timed pulse generator 450 may include a feedback amplifier with bias generation. For example, the feedback amplifier could be implemented as any high gain differential amplifier with one input tied to one of the differential voltages (e.g., "out" or "out_b"), while the other input is tied to a reference voltage which, in one embodiment, may be provided by a bias generator. As described in more detail below, the feedback amplifier may be enabled/disabled by the sense amp enable ("en") signal to eliminate any delay in setting up the reference voltage.

As shown in FIGS. 4A and 4B, feedback amplifier 450 may be configured for receiving one of the differential voltages (e.g., "out_") and for generating a load enable feedback ("load_en_fb") pulse once sense amplifier 400 is enabled. In this circuit, the feedback pulse width is controlled by the difference between the differential voltage ("out_b") and a preset reference voltage (Vref). The feedback loop created between node "out_b" and NMOS load transistors M6a, M6b automatically adjusts the feedback pulse width at different process corners to eliminate circuit sensitivities to process variations.

As shown in FIG. 4B, feedback amplifier 450 may include a first NMOS input transistor (M7) for receiving the differential voltage ("out_b"), a second NMOS input transistor (M8) for receiving the reference voltage ("Vref"), an NMOS enable transistor (M11) for receiving the sense amp enable ("en") signal and a PMOS current mirror (M9, M10) for establishing current paths between a power supply node ("vpwr") and ground ("vgnd") when the sense amp is enabled. For example, a first current path may be established between "vpwr" and "vgnd" through the source-drain paths of current mirror transistor M9, first input transistor M7 and enable transistor M11. A second current path may be established between "vpwr" and "vgnd" through the source-drain paths of current mirror transistor M10, second input transistor M8 and enable transistor M11.

In some cases, a bias generator 455 may also be included within, or otherwise coupled to, feedback amplifier 450. If included, bias generator 455 may include PMOS transistors M12, M13 and M14, with source-drain paths coupled in series between the power supply node ("vpwr") and ground ("vgnd"). More specifically, transistor M12 may be coupled between the "vpwr" node and a bias generator output ("bg_out") node, which is coupled to the gate terminal of transistor M8 for supplying a reference voltage thereto. The gate terminal of transistor M12 may be coupled for receiving an inverted version of the sense amp enable ("en") signal through a first inverter, Inv1. As such, transistor M12 may be configured for charging the bias generator output node once the sense amp is enabled. Transistors M13 and M14 are both turned off once the sense amp is enabled.

The operation of feedback amplifier 450 and bias generator 455 will now be described in reference to FIGS. 4A and 4B. Before the sense amp is enabled, the output node voltages (out and out_b) are precharged to "vpwr" through the pull-up action of transistors M4a, M4b of FIG. 4A. A logic low "en" signal is supplied to the gate terminal of enable transistor M11 to disable the feedback amplifier. The logic low "en" signal is also supplied to bias transistor M14, thereby turning on transistors M13 and M14 and setting the reference voltage "Vref" to a relatively low value (e.g., a value approximately two transistor threshold voltages, or ~2Vtp, above ground). This activates current mirror transistors M9 and M10, enabling those transistors to pull the Vinv node up to a logic high value. The logic high value at the Vinv node is inverted (through a second inverter, Inv2) to generate a logic low load enable feedback ("load_en_fb") pulse for deactivating the NMOS load transistors (M6a, M6b) of current sense amplifier 400.

Once the sense amp is enabled with a logic high "en" signal, the feedback amplifier is also enabled and bias transistors M13 and M14 are turned off. Initially, the out_b node voltage (~vpwr) will be greater than the Vref voltage (~2Vtp). However, the logic high "en" signal is also inverted by Inv1 to activate bias transistor M12. This pulls Vref up to the power supply voltage. At the same time, enable transistor M11 is activated to pull the Vinv node down to a logic low value. The logic low value at the Vinv node is inverted (through Inv2) to generate a logic high load enable feedback ("load_en_fb") pulse for activating the NMOS load transistors (M6a, M6b) of current sense amplifier 400.

Activation of the NMOS load transistors causes the sense amp output node voltages (out and out_b) to be pulled down. When the out_b node voltage drops below Vref (currently at vpwr), the feedback amplifier output pulse ("load_en_fb") will transition from high to low to deactivate the NMOS load transistors (M6a, M6b) of current sense amplifier 400. At this point, the feedback loop is disabled until the next precharge cycle, the optimum common mode voltage has been established at the output nodes (out and out_b) and the sense amp circuit behaves like a conventional current sense stage by developing a voltage differential across the output nodes. Unlike previous embodiments, however, the pulse width of the "load_en_fb" signal is controlled by the comparison of the sense amp output voltage and a predetermined reference voltage. As a result, the feedback loop automatically adjusts the pulse width of the "load_en_fb" signal at different process corners. This enables the operation of sense amp 400 to be relatively insensitive to process variations, providing a more robust sense amp design.

In one embodiment, the predetermined reference voltage could be a fixed DC value or a variable value which starts off low, for example, and then rises to a higher voltage value. In some cases, a fixed reference voltage may be preferred for the sake of simplicity. For example, feedback amplifier 450 may be used to control the pulse width of the "load_en_fb" signal upon receiving a predetermined reference voltage from bias generator 455. The predetermined reference voltage (with a fixed DC value) may be supplied to the gate terminal of transistor M8 for comparison with the output node voltage ("out_b"). As noted above, the fixed DC value (i.e., the optimum common mode voltage of the output nodes) may be determined through simulation techniques prior to sense amp operation.

In other cases, a variable reference voltage may be preferred, as described above. In asynchronous memories, for example, precharge of the bit lines occurs during the duration of an address transition detection (ATD) pulse. This pulse width often varies across process, voltage and temperature (PVT) and may, in some cases, be narrower than desired. If the ATD pulse width is small, the sense amp output nodes (out and out_b) may not precharge to the full power supply level ("vpwr"). Starting the reference voltage at a lower value (e.g., Vref≈2Vtp) ensures, that for the worst case ATD pulse width, the out and out_b voltage values will always be greater than the initial reference value. This guarantees that a "load_en_fb" pulse will always trigger to pull down the output nodes (out and out_b) once the sense amp is enabled. The reference voltage (Vref) may then be raised to the desired DC value (i.e., the optimum common mode voltage of the output nodes) for comparison with the actual out and out_b common mode voltage.

Figure 5:
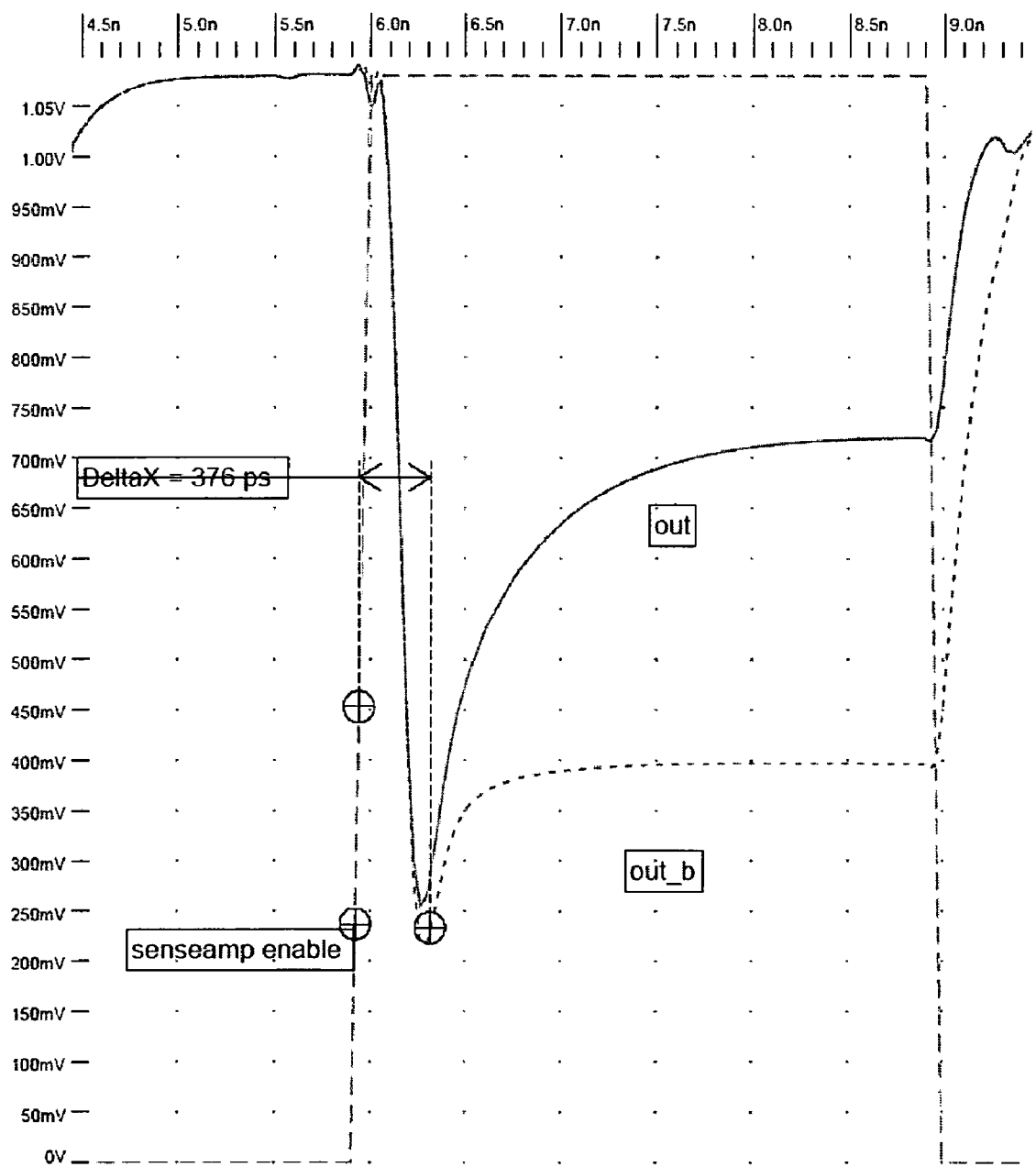
FIG. 5 is a graph illustrating output waveforms for the current sensing stage of FIG. 4A.

FIG. 5 is a graph illustrating output waveforms for current sense amplifier 400. As shown in FIG. 5, the sense amp output nodes (out and out_b) are discharged at a much faster rate than the discharge rate shown in FIG. 2. As such, the differential output voltages generated by sense amp 400 start to split at less than half the time it took using the conventional current sensing scheme (e.g., 376 ps versus 902 ps). In addition, the overall time delay needed to reach a differential output voltage of 100 mV is reduced by more than 60% (in the absence of mismatch), which is very advantageous. In some cases, this overall time delay may even be less than in the embodiment of FIG. 3, due to the fact that feedback amplifier 450 may provide less undershoot than pulse generator 350.

Advantages of the improved current sense amplifier circuits described herein include faster sense amp operation (FIGS. 3 and 4) and improved insensitivity to variations in PVT (FIG. 4). In addition, the improved sense amp designs provide better stability and larger output swing, due to the fact that the PMOS load resistances (M3a, M3b) can now be made large without compromising speed. In some embodiments, a dynamic reference voltage can be used to minimize errors arising from insufficient precharge of the bit lines (e.g., due to variations in ATD pulse width in asynchronous memories).

Embodiments of the present invention are well suited to performing various other steps or variations of the steps recited herein, and in a sequence other than that depicted and/or described herein. For purposes of clarity, many of the details of the above-mentioned current sense amplifiers and methods of designing and manufacturing the same, which are widely known and are not relevant to the present invention, have been omitted from the above description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and/or aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit, comprising:
   a current sense amplifier comprising a pair of output nodes and a first pair of load transistors, each coupled between a different one of the output nodes and ground for pulling the output nodes down to a first voltage value at the beginning of a sense cycle; and a pulse generation circuit configured for activating the first pair of load transistors at the beginning of the sense cycle and deactivating the pair of load transistors once the first voltage is reached.

2. The circuit as recited in claim 1, wherein the current sense amplifier is configured for receiving a pair of differential currents supplied to input nodes of the current sense amplifier and for generating a pair of differential voltages, which are supplied to the pair of output nodes, in response thereto.

3. The circuit as recited in claim 2, wherein the current sense amplifier comprises:

a pair of cross-coupled transistors coupled for receiving the pair of differential currents;

a second pair of load transistors, each coupled between a drain terminal of a different one of the pair of cross-coupled transistors and ground for generating the pair of differential voltages supplied to the output nodes; and an enable transistor coupled between mutually-connected drain terminals of the second pair of load transistors and ground for activating the current sense amplifier at the beginning of the sense cycle.

4. The circuit as recited in claim 3, wherein the current sense amplifier further comprises a pair of pull-up transistors, each coupled between a power supply voltage and a different one of the output nodes for pulling the output nodes up towards the power supply voltage before the current sense amplifier is activated.

5. The circuit as recited in claim 4, wherein a resistance through the second pair of load transistors is substantially greater than a resistance through the first pair of load transistors.

6. The circuit as recited in claim 5, wherein the resistance through the second pair of load transistors is at least an order of magnitude greater than the resistance through the first pair of load transistors.

7. The circuit as recited in claim 4, wherein the pulse generation circuit and the current sense amplifier are each activated by an enable signal supplied to the pulse generation circuit and the enable transistor of the current sense amplifier.

8. The circuit as recited in claim 7, wherein the pulse generation circuit comprises a logic gate and one or more buffers, wherein a first input of the logic gate is coupled for receiving the enable signal, wherein a second input of the logic gate is coupled for receiving a time delayed pulse, and wherein an output of the logic gate is coupled to gate terminals of the first pair of load transistors for supplying a control signal thereto.

9. The circuit as recited in claim 8, wherein by supplying the control signal to the gate terminals of the first pair of load transistors, the pulse generation circuit is configured for deactivating the first pair of load transistors a predetermined time period after the sense cycle begins.

10. The circuit as recited in claim 9, wherein the predetermined time period is substantially equal to a time needed for the output nodes of the current sense amplifier to be discharged to an optimum common mode voltage.

11. The circuit as recited in claim 7, wherein the pulse generation circuit comprises an operational amplifier having a first input coupled for receiving one of the differential voltages, a second input coupled for receiving a reference voltage, and an output coupled to gate terminals of the first pair of load transistors for supplying a feedback control signal thereto.

12. The circuit as recited in claim 11, wherein the reference voltage is substantially equal to an optimum common mode voltage of the output nodes.

13. The circuit as recited in claim 12, wherein by supplying the feedback control signal to the gate terminals of the first pair of load transistors, the pulse generation circuit is configured for deactivating the first pair of load transistors as soon as the received one of the differential voltages falls below the reference voltage.

14. The circuit as recited in claim 11, wherein the operational amplifier comprises:

a first input transistor coupled to the first input of the operational amplifier for receiving the one of the differential voltages;

a second input transistor coupled to the second input of the operational amplifier for receiving the reference voltage; and a second enable transistor coupled for receiving the enable signal.

15. The circuit as recited in claim 14, wherein the operational amplifier further comprises a pair of p-channel transistors coupled in a current mirror configuration, wherein a first leg of the current mirror establishes a current path from a power supply node to ground through a first p-channel transistor of the pair, the first input transistor and the second enable transistor, and wherein a second leg of the current mirror establishes a current path from the power supply node to ground through a second p-channel transistor of the pair, the second input transistor and the second enable transistor.

16. The circuit as recited in claim 15, wherein the operational amplifier further comprises a bias generator having:

a pull-down transistor coupled between an output node of the bias generator and ground for pulling the output node down to a relatively low voltage before the current sense amplifier is activated;

a pull-up transistor coupled between the power supply node and the output node of the bias generator for pulling the output node up to a relatively high voltage upon receiving an inverted version of the enable signal; and wherein the output node is coupled to a gate terminal of the second input transistor for supplying the reference voltage thereto, regardless of whether the output node is pulled down to the relatively low voltage or pulled up to the relatively high voltage.

17. A memory device, comprising:

a plurality of memory cells arranged in rows and columns;

a current sense amplifier coupled for receiving a pair of differential currents from at least some of the plurality of memory cells and configured for generating a pair of differential voltages therefrom, wherein the current sense amplifier comprises:

a pair of output nodes;

a first pair of load transistors, each having a relatively high resistance attributed thereto and coupled between a different one of the output nodes and ground;

a second pair of load transistors, each having a relatively low resistance attributed thereto and coupled between a different one of the output nodes and ground; and a pulse generation circuit coupled for: (i) activating the second pair of load transistors to quickly discharge the output nodes from a relatively high voltage to a relatively low voltage at the beginning of a sense cycle, and (ii) deactivating the second pair of load transistors to enable the first pair of load transistors to generate the pair of the differential voltages at the output nodes, after the relatively low voltage is reached.

18. The memory device as recited in claim 17, wherein the memory device comprises an asynchronous memory device.

19. The memory device as recited in claim 17, wherein the relatively high voltage is a power supply voltage supplied to the current sense amplifier, and wherein the relatively low voltage is close to an optimum common mode voltage attributed to the output nodes.

20. The memory device as recited in claim 19, wherein the pulse generation circuit comprises a two-input logic gate with one input coupled for receiving a time delayed pulse, and an output coupled to gate terminals of the second pair of load transistors for supplying a control signal thereto.

21. The memory device as recited in claim 20, wherein by supplying the control signal to the gate terminals of the second pair of load transistors, the pulse generation circuit is configured for deactivating the second pair of load transistors a predetermined time period after the sense cycle begins.

22. The memory device as recited in claim 21, wherein the two-input logic gate is an AND gate and the time delayed pulse is delayed by one or more buffers, which provide an amount of time needed for the output nodes to reach the relatively low voltage, and wherein the amount of time is substantially equal to the predetermined time period.

23. The memory device as recited in claim 19, wherein the pulse generation circuit comprises an operational amplifier with a first input coupled for receiving one of the differential voltages, a second input coupled for receiving a reference voltage equivalent to the relatively low voltage, and an output coupled to gate terminals of the second pair of load transistors for supplying a feedback control signal thereto.

24. The memory device as recited in claim 23, wherein by supplying the feedback control signal to the gate terminals of the second pair of load transistors, the pulse generation circuit is configured for deactivating the second pair of load transistors as soon as the received one of the differential voltages falls below the reference voltage.

25. The memory device as recited in claim 24, wherein the operational amplifier is configured for automatically adjusting a pulse width of the feedback control signal supplied to the second pair of load transistors, so that operation of the current sense amplifier is unaffected by variations in process, voltage and temperature.

26. A method for operating a current sense amplifier comprising a pair of output nodes, a first pair of load transistors and a second pair of load transistors, the method comprising:
 precharging the pair of output nodes towards a power supply voltage before a sense cycle begins;
 activating the first pair of load transistors to quickly discharge the pair of output nodes at the beginning of the sense cycle; and
 deactivating the first pair of load transistors once a voltage value of the output nodes approaches an optimum common mode voltage, wherein said deactivating enables the second pair of load transistors to generate a pair of differential voltages from a pair of differential currents supplied to the current sense amplifier.

27. The method as recited in claim 26, wherein said deactivating comprises supplying a deactivation control signal to the first pair of load transistors a predetermined amount of time after the beginning of the sense cycle.

28. The method as recited in claim 26, wherein said deactivating comprises comparing the voltage value of the output nodes to a reference voltage and supplying a deactivation control signal to the first pair of load transistors once the voltage value falls below the reference voltage.

29. The method as recited in claim 28, wherein the reference voltage is a fixed direct current (DC) value, which is predetermined and set close to the optimum common mode voltage of the output nodes.

30. The method as recited in claim 28, wherein the reference voltage is a dynamically adjustable value that starts at a lower voltage value before rising to a higher voltage value, which is predetermined and set close to the optimum common mode voltage of the output nodes.

* * * * *